United States Patent [19]
Kubotera et al.

[11] 3,966,472
[45] June 29, 1976

[54] PROCESS FOR PRODUCING PRINTING PLATES

[75] Inventors: Kikuo Kubotera; Eiichi Mizuki, both of Asaka, Japan

[73] Assignee: Fuji Photo Film Co., Ltd., Minami-ashigara, Japan

[22] Filed: Apr. 4, 1973

[21] Appl. No.: 347,762

[30] Foreign Application Priority Data
Apr. 5, 1972   Japan................................ 47-34265

[52] U.S. Cl............................................ 96/33; 96/83
[51] Int. Cl.²..................... G03F 7/02; G03C 1/90
[58] Field of Search..................... 96/33, 87 R, 83

[56] References Cited
UNITED STATES PATENTS

| | | | |
|---|---|---|---|
| 2,458,403 | 1/1949 | Nadeau et al. | 96/87 R |
| 2,462,151 | 2/1949 | Woodward | 96/87 R |
| 2,494,053 | 1/1950 | Mitson et al. | 96/33 |
| 3,053,658 | 9/1962 | Spencer | 96/33 |
| 3,300,306 | 1/1967 | Sevens et al. | 96/33 |
| 3,625,687 | 12/1971 | Dankle | 96/33 |
| 3,658,524 | 4/1972 | Piesach | 96/83 |

OTHER PUBLICATIONS
Woodward et al., Def. Pub. Search Copy of S.N. 849,648, filed 8/13/69, Def. Pub. No. T870,005.
Hartsuch, P. J. Chemistry of Lithography, 1961, Lithographic Technical Foundation, N.Y., pp. 105 & 106.
Tory, B. E. Photolithography, 1953, Graphic Arts Monthly, Chicago, Ill., pp. 182 & 183.

*Primary Examiner*—David Klein
*Attorney, Agent, or Firm*—Sughrue, Rothwell, Mion, Zinn & Macpeak

[57] ABSTRACT

A printing plate having halftones and lines is produced by exposing a photosensitive printing plate material comprising a support having an oleophilic surface, a hydrophilic layer formed thereon and a layer of a direct positive-type photosensitive silver halide emulsion formed on top of the hydrophilic layer through a positive original, developing the exposed material to form a silver image in the emulsion layer, subjecting the developed material to an etch bleaching treatment to remove the hydrophilic layer at portions corresponding to the silver image and to reveal the oleophilic surface, and removing the emulsion layer at a portion on which the silver image is not formed, thereby to reveal said hydrophilic layer. The printing plate can given a number of good quality impressions from the outset of printing, and smeared impressions do not result during continued printing operation.

8 Claims, 7 Drawing Figures

PROCESS FOR PRODUCING PRINTING PLATES

BACKGROUND OF THE INVENTION

1. Field of the Invention

This invention relates to a process for producing a photosensitive printing plate, especially a photosensitive printing plate capable of giving a positive print from a positive original.

2. Description of the Prior Art

General, a planographic printing plate consists of an oleophilic ink-adhering portion forming an image area and a hydrophilic portion forming a non-image area. Such a printing plate is prepared, for example, by a method wherein only an image portion of a hydrophilic surface is rendered oleophilic, or by a method wherein a hydrophilic layer is formed on the surface of an oleophilic substance and the hydrophilic layer is removed only at an image area to reveal the oleophilic surface.

For instance, Japanese Patent Publication No. 27,242/69 discloses a method for producing a printing plate which involves the steps of forming a hydrophilic layer containing a nuclei substance for diffusion transfer on a support having an oleophilic surface, coating a silver halide photographic emulsion on the hydrophilic layer, forming a silver image in the hydrophilic layer by diffusion transfer, and subjecting the photosensitive plate to etch bleaching utilizing the silver image, to thereby remove the corresponding part of the hydrophilic layer and reveal the oleophilic support.

U.S. Pat. No. 3,385,701 discloses a method for producing a printing plate which comprises bringing an exposed negative material into contact with a sheet comprising a support having an oleophilic surface and a hydrophilic layer formed thereon and containing a nuclei substance for diffusion transfer, to thereby form a silver image on the hydrophilic layer, and subjecting the plate to etch bleaching to thereby remove the silver image part of the hydrophilic layer and reveal the oleophilic support.

Belgian Pat. No. 717,465 discloses a method for producing a printing plate which comprises exposing a photosensitive plate consisting of a support, such as polyethylene, which has an oily receptive surface and a coating thereon of a direct positive-type gelatin silver halide emulsion having a melting point of about 82°C., developing the exposed plate to form a positive silver image, and then subjecting it to etch bleaching to thereby etch away the emulsion layer at the silver image area and reveal the oily ink receptive surface. Furthermore, Belgian Pat. No. 717,466 discloses a method for producing a printing plate which comprises exposing a photosensitive plate consisting of a supprort having a non-porous hydrophilic layer not receptive oily ink and having a contact angle of not more than 65° and a coating thereon of a direct positive-type gelatin silver halide emulsion layer having a melting point of not more than 82°C., developing the exposed plate to form a positive silver image, subjecting it to etch bleaching to etch away the emulsion layer at the silver image area and reveal the hydrophilic layer, whereby the image area becomes a hydrophilic layer and the photosensitive layer at the non-image area becomes and oleophilic layer to form a printing plate surface.

Another conventional technique is disclosed in U.S. Defensive Publication No. 833,274, which relates to a method for producing a printing plate which involves exposing and developing a printing plate material composed of a silver halide gelatin emulsion layer and an oleophilic support, removing the image area by etch bleaching to reveal the oleophilic portion, and utilizing the gelatin layer as a hydrophilic portion.

However, when printing is performed using these known printing plates, the hydrophilic layer tends to be exfoliated to cause contamination of impressions and it is difficult to obtain printed copies of good quality. For example, in the printing plate disclosed in Japanese Patent Publication No. 27242/69, the hydrophilic image receiving layer is directly coated on the surface of the oleophilic support, and adhesion between the surface of the support and the hydrophilic layer is not sufficient. Accordingly, during printing, the hydrophilic layer at the non-image area tends to be exfoliated, and contamination of impressions occurs as a result of the adhesion of oily ink thereto.

In an ordinary planographic printing plate in which a hydrophilic layer is directly provided on the surface of an oleophilic support and that portion of the hydrophilic layer which corresponds to the image portion is removed, thus utilizing the difference between the affinity of oily ink for the thus revealed oleophilic surface and for the hydrophilic layer, it is necessary to increase this difference in ink affinity to the greatest possible extent, and to prevent the formation of smeared impressions as a result of adhesion of ink to the non-image area. This can be achieved by increasing the hydrophilicity of the hydrophilic layer as much as possible. This, however, would result in poor adhesion between the oleophilic surface and the hydrophilic layer, which will cause exfoliation of the hydrophilic layer at the non-image area to form smeared impressions printing.

It during has long been desired in the art to overcome these difficulties and to provide printing plates which do not cause smearing. This was achieved by the technique disclosed in Japanese Patent Application No. 9762/1971, which, however, has been found to suffer from the following two defects.

In the printing plate produced by the technique of our prior application (Japanese Pat. Application No. 9762/71), (1) ink adhesion is poor at the time of inking, and impressions of good quality cannot be obtained during the early stage of printing; and (2) continued printing causes the ink to adhere to the non-image area, which in turn results in smeared impressions. As shown in FIG. 7 accompanying this specification which illustrates a conventional printing plate, a non-image area 73 consists of an oleophilic support 70 and a hydrophilic layer 71 and a hardenable gelatin emulsion layer 72 superposed on the support. On the other hand, an image area 74 results from the removal of the hydrophilic layer and the gelatin emulsion layer 72 and the revealing of the surface of the support. Accordingly, the surface of the printing plate forms a concave portion at the image area 74 and a convex portion at the non-image area where the hydrophilic layer and the emulsion layer remain unremoved, thus presenting a relief surface. It has been confirmed that when such a printing surface is directly inked, ink does not adhere stably to the image portion where the area of the convex portion is large and the area of the concave portion is small, that is to say, at fine line or small dot areas.

On the other hand, when printing is continued and the number of printed copies increases, the non-image area is gradually contaminated by the ink. This is as a result of the curing of the emulsion layer which becomes the hydrophilic printing surface, its oil receptivity is increased due to the printing ink, and consequently the ink adheres thereto and causes smeared copies.

SUMMARY OF THE INVENTION

It has now been found that a printing plate material free from the above defects can be obtained by using a thin hydrophilic layer in accordance with the present invention to adhere ink stably to fine lines or small dots from the early states of printing, thereby preventing the contamination of the printing surface even if the number of printed copies increases.

It is therefore one object of this invention to provide a printing plate material capable of giving positive printed copies from a positive original, which is free from the defects of the prior art mentioned above.

Another object of this invention is to provide a printing plate using a positive original, which plate gives printed copies of good quality.

Other objects of the invention will become apparent from the following description.

In accordance with this invention, the above objects are achieved by a process for producing a printing plate, which comprises exposing a photosensitive printing plate material through an original, the printing plate material consisting of a support having an oleophilic surface, a layer of a direct positive-type photosensitive silver halide emulsion formed on the support, and a hydrophilic layer formed between the support and the emulsion layer and capable of being etch-bleached corresponding to a silver image formed in the emulsion layer; developing the exposed material to form a silver image in the emulsion layer; subjecting the material to an etch bleaching treatment to remove the hydrophilic layer at portions corresponding to the silver image and to reveal the oleophilic surface of the support; and removing the emulsion layer at portions in which the silver image is not formed, to thereby reveal said hydrophilic layer.

BRIEF DESCRIPTION OF THE DRAWINGS

One embodiment of the practice of this invention will be described by reference to the accompanying drawings in which.

DETAILED DESCRIPTION OF THE INVENTION

Figure 1:
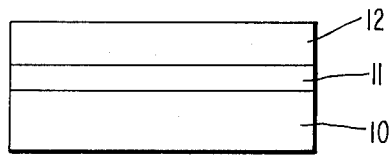
FIG. 1 is a sectional view showing one embodiment of a photosensitive printing plate material in accordance with this invention.

Referring to FIG. 1, the reference numeral 10 represents a support having an oleophilic surface, 11 a hydrophilic layer which can be etch-bleached corresponding to a silver image formed in an emulsion layer, and 12 a direct positive silver halide emulsion layer like numerals are used in the drawings to represent like elements.

Figure 2:
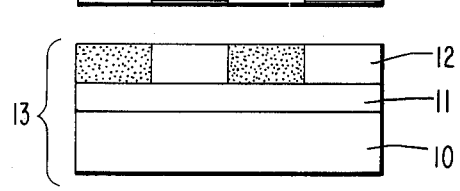
FIGS. 2 to 5 are sectional views of the printing plate material shown in FIG. 1 in the principal steps of producing a printing plate from it in accordance with one embodiment of the present invention.

Referring to FIG. 2, the photosensitive printing plate 13 of this invention is exposed through a positive original 14 having halftone or line images. In the emulsion layer 12 of the printing plate material 13, a latent image is formed corresponding to the non-image area of the original (shown by the dotted areas).

Figure 3:
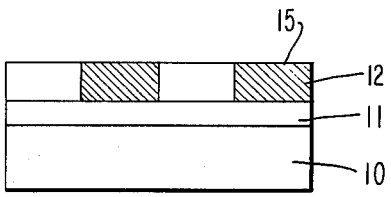
Figure 4:
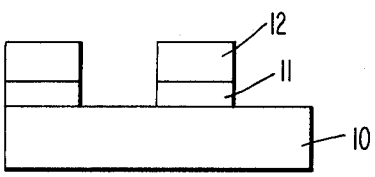
Figure 5:
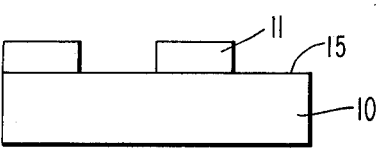

FIG. 3 shows the state of the printing plate material that has been developed. A silver image 15 is formed in the non-exposed areas of the emulsion layer 12 (shown by crosshatching). This image is a positive image the same as the original. Fixation can be performed after the development, but is usually omitted. After rinsing, the material is treated with a known etch bleaching solution, to thereby etch that portion of the emulsion layer which contains the silver image. Simultaneously, that portion of the hydrophilic layer beneath the emulsion layer which corresponds to the silver image is also etched and when the surface of the material is lightly rubbed in a warm water bath using a sponge, the etched portions of the emulsion layer 12 and the hydrophilic layer are completely removed as shown in FIG. 4. This rubbing will also remove the emulsion layer from all portions of the material and will leave the hydrophilic layer beneath the exposed or non-silver image yielding portions, as shown in FIG. 5, whereby the surface of the support is selectively revealed at areas beneath uneposed areas in the silver halide emulsion layer but remains covered by the hydrophilic layer at areas in the silver halide emulsion layer which were exposed. The printing plates so produced can be used in accordance with any conventional method.

Figure 6:
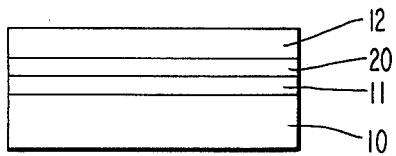
FIG. 6 is a sectional view of a photosensitive printing plate material in accordance with another embodiment of this invention.
Figure 7:
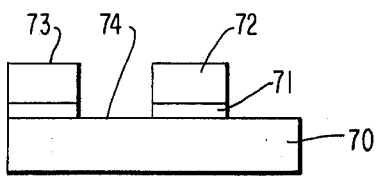
FIG. 7 is a sectional view of a conventional printing plate.

One embodiment of a basic structure of a photosensitive printing plate material for use in the present invention consists of a support having an oleophilic surface, a hydrophilic layer formed thereon and a direct positive photosensitive silver halide emulsion layer coated on top of the hydrophilic layer. Another embodiment of the photosensitive printing plate material consists of a support 10 having an oleophilic surface, a hydrophilic layer 11 formed thereon, an interlayer 20 coated on top of the hydrophilic layer and a direct positive photosensitive silver halide emulsion layer 12 coated on the interlayer, as shown in FIG. 6.

The support may be of any material as is usually employed in this field, for example, resin films such as a polyethylene terephthalate or cellulose acetate film, paper-like sheets, water resistant paper, metal plates or stone plates. When a hydrophilic metal plate such as an aluminum plate is used, an oleophilic layer is formed thereon by a method such as coating, vacuum deposition, plating, spraying or laminating so as to render the surface ink receptive. A polyethylene terephthalate film is frequently used because of its superiority in oleophilicity, dimensional stability, flexibility, etc.

The hydrophilic layer formed on the support should firmly adhere to the surface of the support, and the portions thereof corresponding to a silver image formed in the emulsion layer should be etched by an etch bleaching treatment employed in the preparation of a printing plate. Examples of hydrophilic layers which meet these requirements are solutions or dispersions in organic solvents (which are coated on a support and then dried by an conventional method) of gelatin, gum arabic, alginic acid, hydroxyethyl cellulose, methyl cellulose, carboxymethyl cellulose, polyacrylamide, polyvinyl pyrrolidone, copolymers of these at a mol ratio of ca 1:1, usually at a molecular weight of ca. 100,000 to ca. 500,000, polyvinyl alcohol, polyvinyl alcohol derivatives such as saponified PVA, in general at a degree of saponification of 50–100%, preferably 60–99%, and degree of average polymerrization of 300–5000, preferably 500–2000, a maleic anhydride/-vinyl acetate copolymer usually at a mol ratio of 1:1, a maleic anhydride/ethylene copolymer usually at a mol ratio of 1:1, maleic anhydride/methyl vinyl ether copolymer usually at a mol ratio of 1:1, a maleic anhydride/styrene copolymer usually at a mol rating preferably, 1:1–1:3, half ester derivatives and half amide derivatives of these copolymers 30–50% degree of esterification(methyl, ethyl, propyl, etc. ester), an acrylic acid copolymer e.g., with N-vinyl pyrrolidone, acrylamide, methyl acrylate, methacrylamide, vinyl acetate, diethylacrylamide, at any optional mol rates of comonomers, preferably about 1:1 (mol ratio), a methacrylic acid copolymer e.g., with acrylamide, diethylacrylacrylamide, vinylpyrrolidone methyl acrylate, butyl methacrylate, propyl methacrylate, methyl methacrylate, ethyl methacrylate, at any optional mol ratio of comonomres, preferably about 1:1 (mol ratio), a partially saponified cellulose triacetate, a partially saponified cellulose butyrate, a partially saponified cellulose butyrate, a partially saponified cellulose acetate butyrate or cellulose nitrate usually at a degree of saponification of less than 50%, preferably 0–30%.

The copolymers described above are typically at a 1:1 comonomer mol ratio.

These materials are merely exemplary of the many hydrophilic layer materials useful in the present invention.

The organic solvents used are those capable of dissolving or swelling the surface of the support when the support is amenable to such.

Examples of the organic solvents include acetone, methyl ethyl ketone, cyclohexanone, tetrahydrofuran, dioxiane, methanol, ethanol, ethyl formate, methyl acetate, ethyl acetate, benzene, toluene, methylene chloride, ethylene chloride, tetrachloroethane, trichloroethane, chloroform, chlorobenzene, ethylenechlorohydrin, chlorosulfonic acid, nitromethane, dimethyl formamide, morpholine, formic acid, acetic acid, benzoic acid, salicylic acid, salicylic acid esters, monochloroacetic acid, dichloroacetic acid, trichloroacetic acid, trifluoroacetic acid, 2-nitropropanol, benzyl alcohol, benzaldehyde, acetonitrile acetone, acetophenone, benzamide, benzonitrile, benzylamine, methyl nitotinate, phenol, cresol, and other phenol derivatives such as halogenated phenols, e.g., o-, m- or p- bromo or chlorophenol, nitro-substituted phenols, e.g., o-, m- or p- nitro phenol, and the like. These solvents can be used either alone or in admixtures of two or more thereof. Suitable organic solvents can be selected according to the properties of the support used, i.e., to swell or dissolve the same.

The preparation of an effective hydrophilic layer can be achieved by selecting and controlling its composition or thickness according to the properties of the support on which it is formed, the composition, the degree of hardening and the thickness of the emulsion layer formed thereon, and the amount of silver formed by development. For example, when the degree of hardening is very high, it is hard to etch the layers, and when thickness of the emulsion is much more than 10μ, developing becomes more difficult. However, it is easy to etch the layer in the case of any imaging amount of silver, though in most commercially available emulsions useful in the present invention the silver is present in an amount to provide an optical concentration of about 0.15 or greater. Since an excessively thick hydrophilic layer is disadvantageous to the ease of treatment, printability, etc., the preferred thickness is generally about 0.1 to 2 microns, especially 0.1 to 0.5 micron.

The hydrophilic layer may contain other substances if they meets the requirements mentioned above. For example, it may contain a hydrophilicity-increasing agent such as colloidal silica, or a dye or pigment for easy inspection of the condition of the printing plate surface. For example, colloidal silicas such as Ludox AM, Ludox LS, Ludox HS, Ludox SM-30, Ludox AS sold by E. I. du Pont, carbon black as pigment, and the like.

The hydrophilic layer generally has a contact angle with water of less than 45° at 20°C. Lower contact angles are preferred, with contact angles of 10°–30° being especially preferred. The oleophilic or hydrophilic layer generally has a contact angle of more than 45° at 20°C with water. Higher angles are preferred, with contact angles of 70°–130° being especially preferred.

The photosensitive silver halide emulsion layer can be formed by coating any ordinary direct positive-type emulsion. Usually, silver chloride and silver chloride-bromide are employed as the direct positive-type emulsion. Gelatin is usually used as the binder for the emulsion, but other hydrophilic colloids may also be used, for example, those materials which can used to form the hydrophilic layer heretofore described. The silver halide emulsion used in this invention contains a hardener as is generally known in the art. Typical direct positive photosensitive silver halide emulsions useful in the present invention are disclosed in U.S. Pat. Nos. 3,062,651; 2,983,609; 2,487,850; 2,519,698; 2,591,925; 2,399,083; 3,367,778 and 3,531,290, and in British Pat. Nos. 723,019 and 1186718.

In the photosensitive silver halide emulsions used in the present invention, generally the weight ratio of silver halide to binder is about 1/4 to about 4/1, preferably 1/2 to 3/1.

Most preferred are those emulsions where the silver halide is silver chloride, chlorobromide or bromide, and the binder is gelatin or gelatin derivative.

The kind and amount of the bardener are those usually employed in the art. Specific examples of hardeners include inorganic hardening agents such as potash alum, chrome alum, chrome chloride, chrome sulfite, chrome acetate, and organic hardening agents inlucde aldehyde hardening agents such as formalin, glyoxal, muchloric acid. The amount of hardening agent is generally $10-10^{-4}$% of hardening agent/binder, e.g., gelatin (weight ratio), preferably $5-10^{-3}$%. Neither the hardening agents or the amount recited is, however, limitative.

If desired, the emulsion may contain a variety of sensitizers, antifoggants, surface active agents and other conventional additives.

The emulsion layer must be thick enough to permit an image which enables the etch-bleack of this invention to proceed, but not so thick that removal thereof is difficult-balancing these two factors, a good thickness guideline for the emulsion layer is from about 1 to about 15μ, more preferably 2 to 8μ.

After the etch bleaching treatment, the emulsion layer is removed from the printing plate material. This is accomplished, for example, by dissolving the emulsion layer using warm or cold water, or by mechanically rubbing it away.

In order to render it easy to remove the emulsion layer, an interlayer may be provided between the emulsion layer and the hydrophilic layer. In this case, it is necessary that the interlayer not hamper the etching of the hydrophilic layer corresponding to the silver image formed in the emulsion layer. The interlayer may be formed, for example, by using a hydrophilic polymer having a low degree of cross-linkage or a polymer which becomes hydrophilic on contact with an alkali in the developer solution. The main criterion which the material for the interlayer must exhibit is that it should be removable after the etch bleach treatment, for example, a sample test is by immersion in hot water at 30°–50°C. If it is then removable, it has an acceptable degree of cross-linkage, etc.

Sometimes, hardener incorporated in the hydrophilic layer diffuses into the silver halide emulsion layer where it hardens the emulsion layer and simultaneously strengthens the bond between the emulsion layer and the hydrophilic layer. Consequently, it will be very difficult to remove the emulsion layer even using a warm water bath after the etch bleaching treatment. Furthermore, even if the hardener added to the hydrophilic layer is resistant to diffusion (for example, a polymeric hardener), a hardening reaction may take place at the interface between the emulsion layer and the hydrophilic layer to give similar undesirable results. In order to remove this defect of certain hardeners, it is necessary to form the interlayer between the hydrophilic layer and the emulsion layer to thereby prevent unnecessary bonding therebetween.

The interlayer may be formed from a hydrophilic colloid, for example, a protein such as gelatin or a gelatin derivative, a cellulose derivative (carboxymethyl cellulose or hydroxyethyl cellulose), a metal salt of such a cellulose derivative, such as an alkali metal salt, an alginic acid salt such as an alkali metal or ammonium salt, a starch, or a vinyl derivative (such as polyvinyl alcohol, polyvinyl pyrrolidone, a copolymer of vinyl acetate and maleic anhydride, a copolymer of styrene and maleic anhydride, a copolymer of polyvinyl ether and maleic anhydride, an alkyl methacrylate, or an acrylic acid derivative, including such materials as an acrylic acid copolymer, e.g., with N-vinyl pyrrolicone, acrylamide, methyl acrylate, methacrylamide, vinyl acetate, diethylacrylamide, at any optional mol ratio of comonomers, preferably about 1:1 (mol ratio), a methacrylic acid copolymer, e.g., with acrylamide, diethylacrylamide, vinylpyrrolidone, methyl acrylate, butylmethacrylate, propylmethacrylate, methylmethacrylate, ethylmethaacrylate, at any optional mol ratio of comonomers, preferably about 1:1 (mol ratio), and like materials). Generally, an alginic acid metal salt, a methacrylic acid/vinyl pyrrolidone copolymer, a methacrylic acid/methyl methacrylate copolymer and gelatin are used either alone or as an admixture of two or more thereof as the interlayer.

However, the provision of the interlayer brings about another disadvantage that must be overcome. In order to reveal the oleophilic surface, the interlayer and the hydrophilic layer should be effectively etched at the time of etching the silver image area of the emulsion layer placed on the interlayer. Accordingly, the interlayer must be readily removable to enable a successful revealing of the oleophilic surface of the support. The desired properties of the interlayer can be attained by properly selecting and controlling the binder, compositions, degrees of hardening or thicknesses of the emulsion and hydrophilic layers, the total amount of silver after development, and the proportion between the amount of silver and that of the binder.

The thickness of the interlayer can vary greatly, but considering all of the factors discussed above, a good balance of properties is provided by an interlayer of about 0.1 to about $3\mu$, more preferably $0.3-2\mu$.

Basically, the photosensitive printing plate material used in this invention comprises a hydrophilic layer and a photosensitive emulsion layer which can be etched on a support. If desired, an antihalation layer, a protective layer, etc. may also be formed thereon.

In the preparation of a printing plate, exposure may be effected either by contact printing or by enlarging, utilizing the high sensitivity of silver halide.

The silver image can be formed in the emulsion layer by using any ordinary developer solution comprising a developer such as N-methyl-p-aminophenol, hydroquinone, 1-phenyl-3-pyrazolidone or 2,4-diaminophenol either alone or in admixture.

Fixation may be performed after the development, but is generally omitted. Instead, the material is simply rinsed, and then subjected to the etch bleaching treatment. The etch bleaching liquid can be any known one, such as one containing hydrogen peroxide. In order to promote the etching action, etch bleaching liquid preferably contains an oxidant for the silver image, such as a cupric salt, an acid or a bromide.

Typical etch-bleach solutions used in this invention contain an ordinary oxidizing agent such as hydrogen peroxide or ammonium perioxide which may contain red prussiate, dichromate, perioxusulfate and the like, an insoluble silver salt forming agent such as chloride ions and a metal ion catalyst such as copper ions. The etch-bleach solution may contain a gelatin softening agent such as citric acid or urea.

The oxidizing agents are added in amounts as are used in the prior art to conduct photo-bleaching, and the amount may vary greatly depending upon the exact oxidizing agent or agents selected. Usually, a minimum of 0.35 weight percent is used, though up to 100 weight % can be used with weaker oxidizing agents. For instance, in the case of using hydrogen peroxide, preferably a 1 to 3 weight % solution of hydrogen peroxide is used. Examples of etch-bleach solutions useful in the practice of this invention are illustrated below.

```
Composition example 1:
A   Cupric chloride (dihydrate)              10 g
    Citric Acid                              10 g
    Water added to make                      1 liter
B   Ammonium persulfate                      120 g
    Water added to make                      1 liter
Composition example 2:
A   Water                                    750 cc
    Cupric chloride                          10 g
    Citric acid                              10 g
    Water to make                            1 liter
B   Hydrogen peroxide (30% aq. soln.)        1 liter
```

In the etch-bleach bath it is preferred to add a material such as a cupric salt or acid or material which reacts with silver to form a low solubility complex.

Exemplary of such cupric salts are copper chloride, copper bromide, copper nitrate, copper sulfate, copper citrate and the like, all of which are soluble in water. Cupric halides are preferred.

Illustrative of the acids which can be used are organic acids such as acetic, citric, tartaric acid and the like, and inorganic acids such as hydrochloric, nitric, sulfutic acid and the like.

As materials which form a complex of low solubility by reacting with silver there can be mentioned the halogenides, tartrates and carbonates, with the halogenides being especially effective.

These promoting agents can be used singly or in combination, and the amount added is usually 0.05 to 50% based on the weight of the treating solution. Generally speaking, one would avoid a totally saturated solution and would have a tendency to add the promoting agents so that the total amount of all promoting agents would at most be 50% based on the weight of the treating solution.

Although substantially non-critical in the sense that one merely selects a temperature which permits adequate etch-bleaching to proceed, usually etch-bleaching is at about 5° to about 40°C, more generally 15° to 30°C.

The etch-bleaching step is merely conducted for a time sufficient to etch-bleach the desired layer, and this will vary depending upon the thickness, temperature selected and oxidizing agents used. The etch-bleach treatment will almost always be completed in 10 seconds to 10 minutes, and generally speaking an etch-bleach treatment for 15 seconds to 3 minutes covers important commercial materials.

The removal of that portion of the hydrophilic layer which has been subjected to the etching action leads to the formation of a printing plate. The time and temperature required for the treatment can be easily determined by those skilled in the art in accordance with preliminary tests.

With regard to the developing treatment, while any prior art developing can be used, it is preferred to develop the film at a temperature at which the emulsion layer does not melt, usually at less than 35°C, better yet 10°–30°C. Developing usually takes more than 10 seconds, more generally 20 seconds to 3 minutes.

Washing will generally be at 30°–55°C, particularly 35°–50°C, for layer removal.

It was confirmed that the printing plate prepared by the process of this invention could give several thousand printed copies of good quality in accordance with a conventional method using a commercially available ink and dampening water. Thus, according to the process of this invention, a printing plate that can give good quality impressions can be easily produced using a positive original having halftone gradation or lines.

The following Examples illustrate preferred embodiments of the invention more specifically.

EXAMPLE 1

A 0.18 mm thick polyethylene terephthalate film was surface treated by irradiation with ultraviolet rays. An anti-halation layer was coated on one surface of the film, and the other surface was coated with a gelation dispersion in an organic solvent having the following composition.

| Formulation | |
|---|---|
| Gelatin | 1 g |
| Water | 1 g |
| Acetic acid | 1 g |
| Methanol | 20 g |
| Acetone | 60 g |
| Methylene chloride | 10 g |

| Formulation | |
|---|---|
| Tetrachloroethane | 5 g |
| Phenol | 5 g |

The coated layer was dried for 2 minutes at 120°C to form a hydrophilic layer having a thickness of 0.3 micron.

Then, on top of the hydrophilic layer there was coated a direct positive-type gelatins emulsion containing 0.5 mol of silver per kilogram of the emulsion in a thickness of 4 microns, followed by drying.

A protective layer was formed thereon by coating a 1% aqueous solution of gelatin in a thickness of 1 micron, and the final layer dried to produce a photosensitive printing plate material.

The printing plate material was exposed through a positive original for 30 seconds using a Fuji Exposure Lamp (tradename for a product of Fuji Photo Film Co., Ltd.) as a light source and a Fuji Autoposifilter (yellow) (product of Fuji Photo Film Co., Ltd.) with a voltage of 18 V (450 Lux at element surface). The distance between the printing plate and the light source was 1 m.

The exposed printing plate material was developed for 3 minutes at 25°C. using a developer of the following formulation, to form a silver positive image corresponding to the original.

| Formulation | |
|---|---|
| Metol | 2 g |
| Anhydrous sodium sulfite | 40 g |
| Hydroquinone | 4 g |
| Sodium carbonate monohydrate | 28 g |
| Potassium bromide | 1 g |
| Water to make | 1 liter |

After rinsing, the developed material was immersed for 1 minute at 25°C. in an etch bleaching solution consisting of a mixture of equal amounts of solution I and solution II of the following formulations.

| Solution I | |
|---|---|
| Cupric chloride dihydrate | 10 g |
| Citric acid | 10 g |
| Water to make | 1 liter |
| Solution II | |
| 3% aqueous solution of hydrogen peroxide | |

This treatment resulted in the etching of that portion of the emulsion layer which contained the silver image and the hydrophilic layer beneath it. When the surface of the material was lightly rubbed in warm water at 30°C., the etched portions of the emulsion layer and the hydrophilic layer were removed, and the surface of the support was revealed.

The resulting printing plate was mounted on an ordinary offset printing press, and printing was performed using commercially available ink and dampening water. There were obtained 3,000 line printed copies of good quality.

EXAMPLE 2

Example 1 was repeated except that a mixture of celulose nitrate and gelatin of the following formulation was coated as the hydrophilic layer. Three thousand printed copies of good quality were obtained.

| Formulation | |
|---|---|
| Gelatin | 0.4 g |
| Cellulose nitrate | 0.4 g |
| Water | 0.4 g |
| p-Chlorophenol | 3.0 g |
| Salicylic acid | 0.12 g |
| Methanol | 1.18 g |
| Ethylene chloride | 67.0 g |
| Acetone | 30.0 g |
| Formaldehyde (40% aqueous solution) | 0.2 g |

EXAMPLE 3

Example 1 was repeated except that a mixture of colloidal silica and gelatin of the following formulation was coated in a thickness of 0.5 micron as the hydrophilic layer. Three thousand printed copies of good quality were obtained.

| Formulation | |
|---|---|
| Water | 600 cc |
| Gelatin | 15 g |
| Dodecyl benzenesulfonate (1% aqueous solution) | 50 cc |
| Colloidal silica (tradename, Ludox AM) (30% aqueous solution) | 450 cc |

EXAMPLE 4

Example 1 was repeated except that a cellulose nitrate solution of the following formulation was coated in a thickness of 0.5 micron as the hydrophilic layer. Two thousand printed copies of good quality were obtained.

| Formulation | |
|---|---|
| Cellulose nitrate | 1 g |
| Acetone | 70 g |
| Methanol | 30 g |
| p-Chlorophenol | 2 cc |

EXAMPLE 5

Example 1 was repeated except that a coating solution of the following formulation was coated in a thickness of 0.5 micron as an interlayer between the hydrophilic layer and a silver halide emulsion layer having hardenability (by mucochloric acid; 150 ml of a 2% aqueous solution of mucochloric acid was added per Kg of emulsion). Three thousand printed copies of good quality were obtained.

| Formulation | |
|---|---|
| Methyl methacrylate/acrylic acid copolymer (1 : 1) | 0.5 g |
| Methanol | 100 g |

EXAMPLE 6

Example 1 was repeated except that a coating solution of the following formulation was coated in a thickness of 0.5 micron as a interlayer between the hydrophilic layer and a silver halide emulsion layer having hardenability (by mucochloric acid; 150 ml of a 2% aqueous solution of mucochloric acid was added per Kg of emulsion). Three thousand printed copies of good quality were obtained.

| Formulation | |
|---|---|
| Vinyl acetate/maleic anhydride copolymer (1 : 1, molar) | 1 g |
| Methanol | 100 g |

EXAMPLE 7

Example 3 was repeated except that a coating solution of the following formulation was coated in a thickness of 1 micron between the hydrophilic layer and the silver halide emulsion layer. Three thousand printed copies of good quality were obtained.

| Formulation | |
|---|---|
| Styrene/maleic anhydride copolymer (1 : 1, molar) | 1 g |
| Methanol | 100 g |

EXAMPLE 8

Example 4 was repeated except that a coating solution of the following formulation was coated in a thickness of 1 micron between the hydrophilic layer and the silver halide emulsion layer. Three thousand printed copies of good quality were obtained.

| Formulation | |
|---|---|
| Gelatin | 1 g |
| Water | 100 g |

EXAMPLE 9

Example 1 was repeated except that a coating solution of the following formulation was coated in a thickness of 1 micron between the hydrophilic layer and the silver halide emulsion layer. Three thousand printed copies of good quality were obtained.

| Formulation | |
|---|---|
| Gelatin | 1 g |
| Sodium alginate | 1 g |
| Chromium sulfate | 0.1 g |
| Water | 400 g |

While the invention has been described in detail and with reference to specific embodiments thereof, it will be apparent to one skilled in the art that various changes and modifications can be made therein without departing from the spirit and scope thereof.

What we claim is:

1. A process for producing a printing plate, which comprises exposing a photosensitive printing plate material through an original, said printing plate material consisting of a support having an oleophilic surface, a layer of a direct positive-type photosensitive silver halide emulsion formed on said support, a hydrophilic layer applied between said support and said emulsion layer capable of being etch-bleached corresponding to a silver image to be formed in said emulsion layer and an interlayer formed between said emulsion layer and said hydrophilic layer for easy removal of the emulsion layer after the etch-bleaching treatment, said interlayer being etch-bleachable along with the hydrophilic layer and being removable after etch-bleaching with said emulsion layer, said interlayer being removable from said hydrophilic layer by immersion in water of 30°–50° C; developing the exposed material to form a silver image in the non-exposed areas in said emulsion layer; subjecting the developed material to an etch-bleaching treatment to remove the interlayer and hydrophilic layer at a portion corresponding to the silver image in the non-exposed areas and to reveal the oleophilic surface of the support; and removing the interlayer and the emulsion layer at the exposed portion on which the silver image is not formed, thereby to reveal said hydrophilic layer.

2. The process of claim 1 wherein said support is a polyethylene terephthalate film.

3. The process claim 1 of the preceding claims wherein said hydrophilic layer has a thickness of 0.1 to 2 microns.

4. The process of claim 3 wherein the thickness is 0.1 to 0.5 micron.

5. The process of claim 1 where the oleophilic surface has a contact angle with water at 20°C of more than 45° and the hydrophilic layer has a contact angle with water at 20°C of less than 45°.

6. The process of claim 5 where the contact angle of the oleophilic surface is 70°–130° and that contact angle of the hydrophilic layer is 10°–30°.

7. The process of claim 1 where the silver halide emulsion layer contains a hardener.

8. The process of claim 1 where the silver halide emulsion layer is 1–15$\mu$ thick.

* * * * *